United States Patent [19]

Guidoux

[11] 4,092,618
[45] May 30, 1978

[54] DISCRETE TRANSVERSAL FILTER

[75] Inventor: Loic Bernard Yves Guidoux, Le Plessis Robinson, France

[73] Assignee: Telecommunications Radioelectriques et Telephoniques T.R.T., Paris, France

[21] Appl. No.: 748,698

[22] Filed: Dec. 8, 1976

[30] Foreign Application Priority Data

Dec. 22, 1975 France .................................. 75 39295

[51] Int. Cl.² .......................... H03H 7/10; H03H 5/00
[52] U.S. Cl. .................................. 333/70 T; 333/28 R
[58] Field of Search ............................ 333/28 R, 70 T

[56] References Cited

U.S. PATENT DOCUMENTS

| | | | |
|---|---|---|---|
| 3,660,785 | 5/1972 | Hosokawa | 333/70 T |
| 3,723,911 | 3/1973 | Forney, Jr. | 333/70 T |
| 3,860,892 | 1/1975 | Speiser et al | 333/70 T |

Primary Examiner—Alfred E. Smith
Assistant Examiner—Harry E. Barlow
Attorney, Agent, or Firm—Frank R. Trifari; Simon L. Cohen

[57] ABSTRACT

Digital transversal filter for realizing a lowpass filter with a cut-off frequency $f_g$ and an impulse response $h_1(i)$, a lowpass filter having a cut-off frequency $2f_g$ which has a transfer characteristic which is in phase with the first-mentioned lowpass filter, as well as a lowpass filter with a quadrature transfer characteristic of the in-phase filter.

2 Claims, 2 Drawing Figures

DISCRETE TRANSVERSAL FILTER

BACKGROUND OF THE INVENTION (A) 1. Field of the Invention

The invention relates to a discrete transversal filter with a given cut-off frequency for processing input samples $x(n)$ and for producing output samples $y(n)$ which occur with a predetermined output sampling frequency $f_s$ which is equal to an integral multiple of said cut-off frequency, which discrete filter has a predetermined lowpass transfer characteristic which is related to the transfer characteristic of a predetermined lowpass filter having an impulse response $h_1(i)$, said discrete filter comprising:

an input for receiving said input samples $x(n)$;

a tapped delay line for storing and producing N input samples $x(n)$ wherein the delay time of the delay line situated between each two successive tapes is equal to $1/f_s$;

first storage means for storing and producing filter coefficients $h_1(i)$;

first multiplying means for multiplying each of the input samples produced at the said taps with a corresponding filter coefficient for generating modified input samples $z(n, i) = h_1(i) \times (n - i)$;

first adder means;

first means for coupling the input circuit of the first adder means to the output circuit of the first multiplying means.

(A) 2. Description of the Prior Art

Discrete filters may be divided into two classes (see chapter D, reference 1), namely:

1. Sampled-data filters. The input signal samples $x(n)$ occurring in these filters as well as the output signal samples $y(n)$ are not amplitude-discrete. In such a filter the delay line is formed by a shift register for non-amplitude discrete samples. This shift register may be constructed by means of, for example, "charge coupled devices" (C.C.D's).

2. Digital filters. The input samples $x(n)$ occurring in these filters and the output signal sample $y(n)$ as well as the filter coefficients are amplitude-discrete and are available in the form of digital numbers with a given number of bits. Herein the delay line is again constituted by a shift register, however, each of the shift register elements is now arranged for storing and releasing a digital number $x(n)$. It should be noted that the representation of these digital numbers (see also reference 1) is of no importance for the present invention.

A discrete transversal filter is a device which is used for producing output samples $y(n)$ which are each related to the sum of a plurality of N algebraic products which in turn are each related to N input samples $x(n)$, the relation between $y(n)$ and $x(n)$ being given by the equation:

$$y(n) = \sum_{i=0}^{N-1} a(i) x(n - i) \qquad (1)$$

Herein $a(i)$ represent constant coefficients which are a function of the transfer characteristic of the desired filter.

The expression (1) which an output signal sample $y(n)$ must satisfy is the same for the above-mentioned kinds of discrete transversal filters. Consequently, what follows herebelow applies to both sampled-data filters and to digital filters and the invention will be further explained with reference to a digital filter.

As has already been observed the filter coefficients $a(i)$ are a function of the transfer characteristic of the desired filter. For a lowpass filter with an impulse response $h_1(i)$ therefore:

$$a(i) = h_1(i) \qquad (2)$$

In analog signal processing a second lowpass filter having a cut-off frequency $2f_g$ can be derived from a given lowpass filter having a cut-off frequency $f_g$ and an impulse response $h_1(t)$. If the impulse response of this second lowpass filter is represented by $h_F(t)$ then (see reference 2)

$$h_F(t) = h_1(t) \cos 2\pi f_g t \qquad (3)$$

In complete agreement herewith it applies that a lowpass discrete filter having a cut-off frequency $2f_g$ can be derived from a lowpass discrete filter having a cut-off frequency $f_g$ and an impulse response $h_1(i)$. If $h_F(i)$ represents the impulse response of the lowpass discrete filter having a cut-off frequency $2f_g$, then it holds, for example, that:

$$h_F(i) = h_1(i)\cos(2\pi i f_g/f_s) \qquad (4)$$

The filter coefficients of this filter will be designated by $a_F(i)$ and these coefficients can again be given by the equation:

$$a_F(i) = h_F(i) \qquad (5)$$

The filter having the impulse response defined in expression (4) will hereinafter be referred to as in-phase filter.

In, for example, single sideband and vestigial sideband modulation systems (see, for example, reference 3) not only a filter having the impulse response defined in expression (4) but also a filter having a pulse response of the form:

$$h_Q(i) = h_1(i)\sin(2\pi i f_g/f_s) \qquad (6)$$

is used. The filter coefficients of this filter will be indicated by $a_Q(i)$ and are again given by the expression $$a_Q(i) = h_Q(i) \qquad (7)$$

The filter having the impulse response defined in expression (6) will hereinafter be referred to as a quadrature filter.

Depending on the type of modulation system for data signals and depending on the bit rate of these data signals use will be made in such a modulation system of one of more of said lowpass filters with cut-off frequency $f_g$ or one or more of the in-phase filters or each time an in-phase filter will be used together with a quadrature filter. This means that for each type of modulation system the relevant filters must be available. The modulation systems in which the in-phase filters are used and in which data signals are processed which occur at a bit rate of $f_s$ are furthermore often completed with the above-mentioned lowpass filters with cut-off frequency $f_g$ which are suitable for processing data signals which are applied thereto with a bit rate $f_s/2$.

The use of the discrete in-phase and quadrature filter in said modulation system results for example in the application of two discrete filters which operate fully independently, the coefficients $a_F(i)$ being used in the in-phase filter and the coefficients $a_Q(i)$ in the quadrature filter. A second possibility which results in a considerably simpler discrete filter is to first modify each of the input samples $x(n-i)$ with a relevant coefficient $h_1(i)$ of the lowpass filter having the cut-off frequency $f_g$ to produce modified input samples $z(n,i) = h_1(i)x(n-i)$ and to multiply thereafter each of these modified input samples $z(n,i)$ where $(i = 0, 1, 2, \ldots N-1)$ by either a relevant coefficient $\cos(2\pi i f_g/f_s)$ or by a coefficient $\sin(2\pi i f_g/f_s)$ for realizing the in-phase or quadrature filter respectively.

(B) SUMMARY OF THE INVENTION

It is an object of the invention to provide a discrete transversal filter which is particularly simple in construction, with which each of the three above-mentioned transfer characteristics can be realized and which is switchable in a particularly simple manner between each of these three transfer characteristics and wherein the plurality of multiplications to be performed for realizing the in-phase or quadrature filter respectively is considerably smaller than in the second possibility described above.

The above objectives are realized by the fact that in accordance with the present invention said first coupling means in the discrete transversal filter comprises - second adder means which are coupled with said first multiplying means for generating sum values $P(n, r)$ which are each related to the modified input samples $z(n, i)$ in conformity with the expression $$P(n,r) = \sum_{k=0}^{[(N-1-r)f_g/f_s]} z(n, r + kf_s/f_g) \quad (8)$$

where $r = 0, 1, 2 \ldots (\frac{f_s}{f_g} - 1)$;

second multiplying means;
second coupling means for coupling the output circuit of the second adder means to the input circuit of the second multiplying means;
means for producing a first, a second and a third set of coefficients $\{a(1, r)\}, \{a(2, r)\}, \{a(3, r)\}$ of which first set of coefficients $\{a(1, r)\}$ the elements $a(1, r)$ are given by: $a(1, r) = 1$,
of which second set of coefficients $\{a(2, r)\}$ the elements $a(2, r)$ are given by: $a(2, r) = \cos(2\pi r f_g/f_s)$, of which third set of coefficients $\{a(3, r)\}$ the elements $a(3, r)$ are given by $a(3, r) = \sin(2\pi r f_g/f_s)$;
means for selectively applying the first, the second and the third set of coefficients $\{a(q, r)\}$ to said multiplying means;
third coupling means for coupling the output circuit of the second multiplying means to the input circuit of the first adder means.

In expression (8) $[(N-1-r)f_g/f_s]$ represents the largest integral value which is smaller than $(N-1-r)f_g/f_s$.

The invention utilizes the periodic character of the trigonometric functions $\cos(2\pi i f_g/f_s)$ and $\sin(2\pi i f_g/f_s)$. First those modified input samples $z(m, r)$ are added together which must be multiplied by the same value of $\cos(2\pi r f_g/f_s)$ or $\sin(2\pi r f_g/f_s)$. This intermediate addition does not affect the realization of the original lowpass filter with cut-off frequency $f_g$ but it results in the fact that only $f_s/f_g$ extra multiplications need be performed to realize the in-phase or the quadrature filter respectively.

Because in this discrete filter the input samples $x(n)$ are first multiplied by the filter coefficients $h_1(i)$ of the lowpass filter with cut-off frequency $f_g$ and by multiplying the products $z(n, i) = h_1(i)x(n-i)$ thus obtained by either the coefficients $a(1, r) = +1$ or the coefficient $a(2, r) = \cos(2\pi r f_g/f_s)$ or the coefficients $a(3, r) = \sin(2\pi r f_g/f_s)$ each of the three lowpass filters described above can be realized.

In case $f_s = 4\gamma f_g$ where $\gamma = 1, 2, 3, \ldots$ the number of multiplications which must be additionally performed to realize either the in-phase or the quadrature filter can be reduced by a factor of two. To that end, according to a further embodiment of the discrete filter according to the invention the second coupling means are provided with means for supplying a first coefficient $\alpha = +1$ and a second coefficient $\beta = -1$;
third multiplying means to which sum value $P(n, m)$ where $$m = \frac{f_s}{2f_g}, (\frac{f_s}{2f_g} + 1), \ldots, (\frac{f_s}{f_g} - 1)$$

are applied;
means for selectively applying the coefficients $\alpha$ and $\beta$ to the third multiplying means for generating modified sum values $S(n, m)$;
means for adding sum values and modified sum values together for generating values $R(n, r)$ which are given by:

$$R(n, r) = P(n, r) + S(n, r + f_s/(2f_g)) \quad (9a)$$

where
$$r = (0, 1, 2 \ldots, (f_s/2f_g) - 1); \quad (9b)$$

means for applying the values $R(n, r)$ to said second multiplying means for generating products $$Q(q, n, r) = a(q, r) \cdot R(n, r) \quad (10)$$

where $q = 1, 2, 3$ and $r = 0, 1, 2, 3 \ldots, (f_s/2f_g) - 1)$.

Hereinafter the lowpass filter with cut-off frequency $f_g$ will be indicated by "filter F", the in-phase filter by "filter $F_D$" and the quadrature filter by "filter $F_Q$".

(C) SHORT DESCRIPTION OF THE FIGURES

(D) REFERENCES

1. Terminology in Digital Signal Processing; L.R. Rabiner et al, IEEE Transactions on Audio and Electro acoustics, Vol. AU-20, No. 5, December 1972; pp 322–337.
2. The Fourier Integral and its Applications; A. Papoulis McGraw-Hill Book Company INC. 1962.
3. Ein Einseitenbandsystem fur Datenubertragung; P. Lenthold, F. Tisl; Archiv der Elektrischen Ubertragung (AEU), Band 21, Heft 7, 21. Juli 1967, pp 354–362.

(E) DESCRIPTION OF THE EMBODIMENTS

(E.1) The in-phase and quadrature filter

Figure 1:
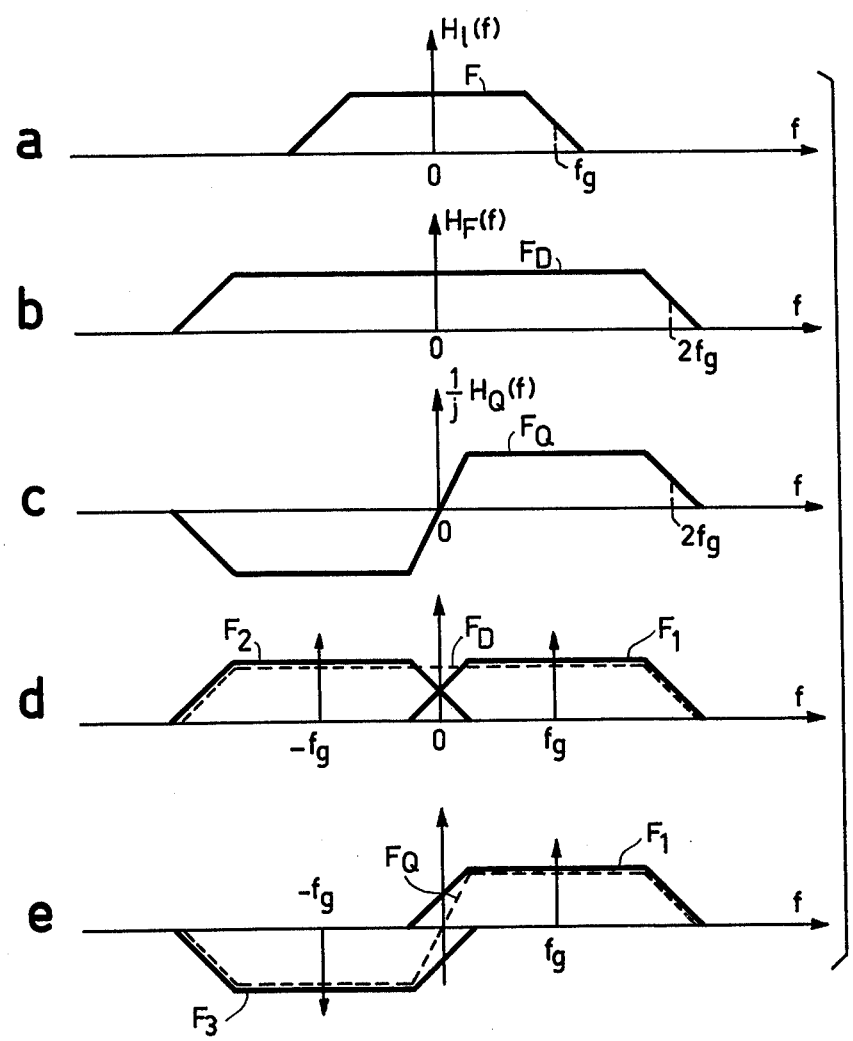
FIG. 1 shows a lowpass transfer characteristic with cut-off frequency $f_g$ and the in-phase lowpass transfer characteristic with cut-off frequency $2f_g$ derived therefrom and also the lowpass transfer characteristic with cut-off frequency $2f_g$ of the quadrature filter of this in-phase filter.

In FIG. 1 a indicates the transfer function $H_1(f)$ of a lowpass filter for analog signals. This filter has a cut-off frequency $f_g$. In agreement with the foregoing the impulse response of this filter is $h_1(t)$. The transfer function of the in-phase filter which can be derived from this lowpass filter in a manner indicated at d is shown in FIG. 1 at b. The cut-off frequency of this in-phase filter has been chosen equal to 3000Hz. The impulse response $h_F(t)$ of this filter is given by (3) and the transfer function $H_F(f)$ is given by (see reference 2) $H_F(f) = \frac{1}{2} H_1(f+f_o) + \frac{1}{2} H_1(f-f_o)$. The transfer function of the quadrature filter of the in-phase filter which can also be derived from the lowpass filter shown at a in FIG. 1, namely in a manner shown at e in FIG. 1 and which has the same cut-off frequency of 3000Hz as the in-phase filter is shown at c in FIG. 1. The impulse response $h_Q(t)$ of this quadrature filter is given by $h_Q(t) = h_1(t) \sin 2\pi f_o t$ and its transfer function $H_Q(f)$ by (see reference 2) $H_Q(f) = \frac{1}{2} j [H_1(f+f_o) - H_1(f-f_o)]$.

The above relationship between $H_1(f)$, $H_F(f)$ and $H_Q(f)$ also applies to the transfer functions of an in-phase discrete filter and a quadrature discrete filter. More particularly it then holds that the transfer function $H'_1(f)$ of a discrete lowpass filter which is derived from the lowpass filter with the transfer function shown at a in FIG. 1 is given by:

$$H'_1(f) = \sum_{n=-\infty}^{\infty} H_1(f - nf_s) \quad (11)$$

For $n = 0$ this transfer function is identical to that of the above-mentioned lowpass filter for analog signals. In (11) $f_s$ again represents the output sampling frequency of the discrete filter.

In an analogous manner it applies for the transfer functions $H'_F(f)$ and $H'_Q(f)$ of the in-phase and quadrature discrete filter respectively:

$$H'_F(f) = \sum_{n=-\infty}^{\infty} H_F(f - nf_s) \quad (12)$$

$$H'_Q(f) = \sum_{n=-\infty}^{\infty} H_Q(f - nf_s) \quad (13)$$

(E. 2) The Discrete Filter

Figure 2:
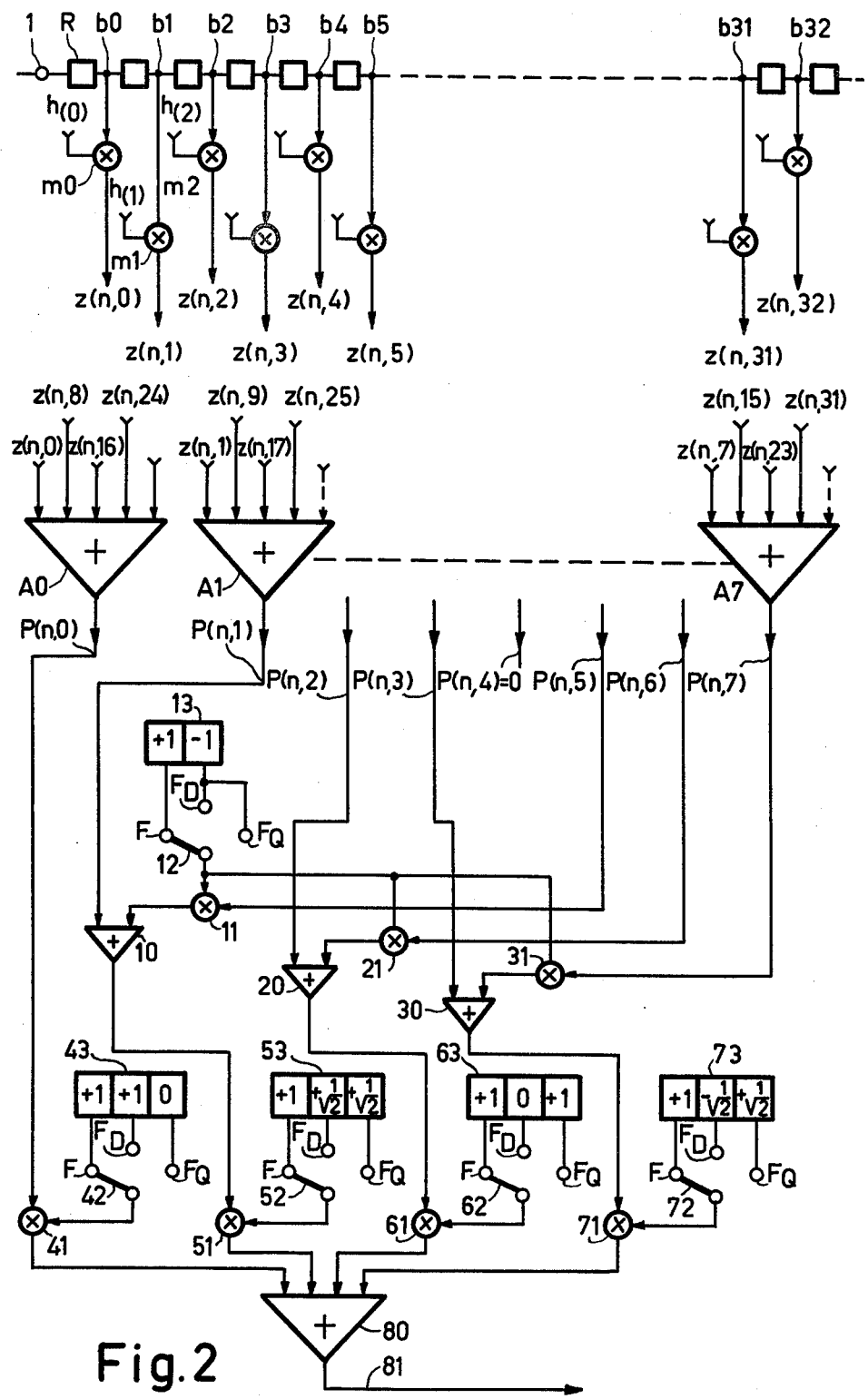
FIG. 2 shows a preferred embodiment of the discrete transversal filter according to the invention.

FIG. 2 shows a discrete filter in the form of a transversal digital filter. In accordance with the invention this filter is arranged for realizing the transfer functions given in the expressions (11), (12) and (13) (see also at a, b and c in FIG. 2). This digital filter comprises an input 1 to which multi-bit code words $x(n)$ are applied with a frequency which is equal to the output sampling frequency $f_s$. In this embodiment $f_s = 8f_g = 24$ kHz.

The input 1 of the filter is connected to a delay line which is formed by identical delay sections R which each have a delay time $1/(8f_g)$. Connected to the taps $b_o, b_1, b_2 \ldots b_{32}$ between the delay elements R are multipliers $m_o, m_1, m_2 \ldots m_{32}$ which each multiply the code words $x(n-i)$, which are produced at the respective taps by the samples $h_o, h_1, h_2 \ldots h_{32}$ of the impulse response of the filter F. To that end these samples are stored in known manner in a store (not shown). As usual these samples will be referred to as coefficients of the filter F.

To realize the filter F it is sufficient, as known, to add together all weighted signals $z(n,i)$ where $i = 0, 1, 2, \ldots 32$ which occur at the outputs of multipliers $m_o, m_1, m_2 \ldots m_{32}$. In the present transversal digital filter this addition is performed by means of several adders.

Circuits $A_o, A_1, \ldots A_7$ which, owing to the weighted signals $z(n,i)$ produce eight sum values $P(n,r)$ where $P(n,r)$ is given by equation (8) which, for this concrete case, changes into $$P(n,r) = \sum_{k=0}^{[(32 - r/8)]} z(n, r + 8i)$$

The adder $A_o$ is shown for completeness only, namely to indicate how the sum value $P(n,o)$ is formed; in actual practice this adder may be omitted for this special case because all modified input samples $z(n,i)$ which occur at its inputs are zero, except $z(n,o)$. On the other hand it is not necessary to have an adder $A_4$ for forming the sum value $P(n,4)$ as it can be proved that this last sum value is always equal to zero.

This filter also comprises means for forming four difference values between the four first sum values $P(n,o), P(n,1), P(n,2), P(n,3)$ and the four last sum values $P(n,4), P(n,5), P(n,6), P(n,7)$. Actually the filter does not comprise any circuit for forming the difference value $P(n,0) - P(n,4) = R(n,0)$ which is equal to $P(n,o)$ as $P(n,4) = 0$. For forming the difference value $R(n,1) = P(n,1) - P(n,5)$ use is made of an adder circuit 10 to whose inputs the sum values $P(n,1)$ and $-P(n,5)$ are applied; the latter value $-P(n,5)$ is formed by means of the multiplier 11 to which sum value $P(n,5)$ is applied and to which a number $-1$ can be applied through the commutating circuit 12, namely setting this commutating circuit 12 in the position $F_D$ or $F_Q$. This number $-1$ is stored in the storage element 13. By setting the commutating circuit 12, as shown in the Figure, to the position F the number $+1$ which is also stored in the storage element 13 is applied to the multiplier 11 which then causes the adder 10 to produce the value $P(n,1) + P(n,5)$. As shown in the Figure the difference values $R(n,2) = P(n,2) - P(n,6)$ and $R(n,3) = P(n,3) - P(n,7)$ are formed in the same manner by the adders 20 and 30, the multipliers 21 and 31 and the commutating circuit 12. If the commutating circuit 12 is set to the position F the adder circuits 20 and 30 produce the signals $P(n,2) + P(n,6); P(n,3) + P(n,7)$.

This transversal digital filter also comprises means for multiplying the four different signals $R(n,0), R(n,1), R(n,2), R(n,3)$ with the values of $\cos(2\pi rf_g/f_s) = \cos(\pi r/4)$ respectively and with the values of $\sin(\pi r/4)$ respectively where $r = 0, 1, 2, 3$. Said last-mentioned means are constituted by multipliers 41, 51, 61, 71 to which the values $R(n,r)$ with $r = 0, 1, 2, 3$ are applied. The other inputs of these multipliers are connected through commutating circuits 42, 52, 62, 72 to storage elements 43, 53, 63, 73. By setting each of the commutating circuits to the position $F_D$ the numbers $+1, +\frac{1}{2}\sqrt{2}, 0, -\frac{1}{2}\sqrt{2}$ respectively are applied to the multipliers 41, 51, 61, 71 which numbers correspond to the values of $\cos(\pi r/4)$ respectively for $r = 0, 1, 2, 3$. If the commutating circuits are set to the position $F_Q$ the numbers $0, +\frac{1}{2}\sqrt{2}, +1, +\frac{1}{2}\sqrt{2}$ are applied to the multiplier which numbers correspond to the values of $\sin(\pi r/4)$ respectively for $r = 0, 1, 2, 3$. As shown in FIG. 4 the numbers +1 are applied to the multipliers 41, 51, 61, and 71 if the commutating circuits are set to the position F.

The outputs of the amplifiers 41, 51, 61, 71 are connected to the inputs of the adder 80, the output 81 of which constitutes the output of the filter.

From the above it follows that if all the commutating circuits 12, 42, 52, 62 and 72 are set to the position F a filter is realized having the transfer characteristic indicated at a in FIG. 1. If all commutating circuits are set to the position $F_D$ then a filter is realized having the transfer characteristic indicated at b in FIG. 1. Finally, if all commutating circuits are set to the position $F_Q$ then a filter is realized having the transfer characteristic indicated at c in FIG. 1.

What is claimed is

1. A discrete transversal filter having a giving cut-off frequency for processing input samples $x(n)$ and for generating output samples $y(n)$ which occur with a predetermined output sampling frequency $f_s$ which is equal to an integral multiple of said cut-off frequency, which discrete filter has a predetermined lowpass transfer characteristic which is related to the transfer characteristic of a predetermined lowpass filter with impulse response $h_1(i)$, said discrete filter comprising:

an input for receiving the input samples $x(n)$;

a tapped delay line for storing and producing N input samples $x(n)$ wherein the delay time of the delay line situated between each two successive taps is equal to $1/f_s$;

first storage means for storing and producing filter coefficients $h_1(i)$;

first multiplier means for multiplying each of the input samples produced at the said taps with a corresponding filter coefficient for generating modified input samples $z(n,i) = h_1(i) \cdot x(n-i)$;

first adder means;

first means for coupling the input circuit of the first adder means to the output circuit of the first multiplying means;

the first coupling means comprising:

second adder means which are coupled to said first multiplying means for generating sum values $P(n,r)$ which are each related to the modified input samples $z(n,i)$ according to the expression $$P(n,r) = \sum_{k=0}^{[(N-1-r)f_g/f_s]} z(n,r + kf_s/f_g)$$

where
$r = 0, 1, 2 \ldots,$ $(\frac{f_s}{f_g} - 1)$ second multiplying means;

second coupling means for coupling the output circuit of the second adder means to the input circuit of the second multiplying means;

means for producing a first, a second and a third set of coefficients $\{a(1,r)\}$, $\{a(2,r)\}$, $\{a(3,r)\}$, of which first set of coefficients $\{a(1,r)\}$, the elements $a(1,r)$ are given by $a(1,r) = 1$, of which second set of coefficients $\{a(2,r)\}$ the elements $a(2,r)$ are given by $a(2,r) = \cos(2\pi r f_g/f_s)$, of which third set of coefficients $\{a(3,r)\}$ the elements $a(3,r)$ are given by $a(3,r) = \sin(2\pi r f_g/f_s)$;

means for selectively applying the first, the second and the third set of coefficients $\{a(q,r)\}$ to the second multiplying means;

third coupling means for coupling the output circuit of the second multiplying means to the input circuit of the first adder means.

2. A discrete transversal filter as claimed in claim 1, wherein $f_s$ is equal to $4\gamma$ times the cut-off frequency of the lowpass filter with impulse response $h_1(i)$, in which $\gamma = 1, 2, 3, \ldots,$ said second coupling means comprising:

means for producing a first coefficient $\alpha = +1$ and a second coefficient $\beta = -1$;

third multiplying means to which sum values $P(n,r)$ where $$m = \frac{f_s}{2f_g}, (\frac{f_s}{2f_g} + 1), (\frac{f_s}{f_g} - 1)$$

are applied; means for selectively applying the coefficients $\alpha$ and $\beta$ to the third multiplying means for generating modified sum values $S(n,m)$;

means for adding together the sum values and modified sum values for generating values $$R(n,r) = P(n,r) + S(n,r + f_s/(2f_g))$$

where
$r = 0, 1, 2, 3, \ldots$ $(\frac{f_s}{2f_g} - 1)$ means for applying the values $R(n,r)$ to said second multiplying means for generating products $Q(q,n,r) = a(q,r) \cdot R(n,r)$ where
$q = 1, 2, 3$ and $r = 0, 1, 2, 3 \ldots$ $(\frac{f_s}{2f_g} - 1).$

* * * * *